United States Patent [19]

Schelhorn

[11] Patent Number: 4,967,315

[45] Date of Patent: Oct. 30, 1990

[54] METALLIZED CERAMIC CIRCUIT PACKAGE

[75] Inventor: Robert L. Schelhorn, Vincentown, N.J.

[73] Assignee: General Electric Company, Moorestown, N.J.

[21] Appl. No.: 459,899

[22] Filed: Jan. 2, 1990

[51] Int. Cl.$^5$ .................................................. H05K 9/00
[52] U.S. Cl. .................................. 361/424; 174/35 R; 174/51; 174/52.4
[58] Field of Search ................ 361/212, 220, 393–395, 361/399, 422, 424, 380, 412, 413, 398, 400, 403, 429; 174/35 R, 35 GC, 51, 52.3, 52.4; 334/85; 455/347, 348

[56] References Cited

U.S. PATENT DOCUMENTS

| | | |
|---|---|---|
| 3,311,791 | 3/1967 | Larson et al. . |
| 3,548,076 | 12/1970 | Cooke et al. . |
| 3,795,884 | 3/1974 | Kotaka .................................. 361/413 |
| 3,950,603 | 4/1976 | Brefka . |
| 4,150,393 | 4/1979 | Wilson et al. . |
| 4,487,999 | 12/1984 | Baird et al. . |
| 4,533,976 | 8/1985 | Suwa .................................... 361/413 |
| 4,806,704 | 2/1989 | Belke, Jr. ........................... 174/52.4 |
| 4,814,943 | 3/1989 | Okuaki ............................... 174/52.4 |
| 4,829,432 | 5/1989 | Hershberger et al. . |
| 4,831,211 | 5/1989 | McPherson et al. . |
| 4,855,808 | 8/1989 | Tower ................................. 174/52.4 |

Primary Examiner—Gerald P. Tolin
Attorney, Agent, or Firm—William H. Meise

[57] ABSTRACT

The individual components of a shielded ceramic, RF mounting package are metallized on three of their outer surfaces. The package includes circuit supporting ceramic substrate metallized along its edges as well as on the horizontal surfaces to permit continuous metal contact between the substrate and a metallized ceramic seal ring and the metal lid and base of the package.

2 Claims, 2 Drawing Sheets

METALLIZED CERAMIC CIRCUIT PACKAGE

This invention relates to a circuit package for microwave components and, more particularly, to a ceramic package having metallized patterns over more than one plane of the ceramic structure to shield the components supported in the package.

BACKGROUND OF THE INVENTION

Microwave circuit components, whether of the hybrid or monolithic type, are customarily mounted in metallic packages which provide EMI and RFI shielding. Typically, a substrate on which the hybrid or monolithic circuits are mounted, is supported within a grounded metallic housing. Connections to the circuits are made through insulated input and output ports in the housing. Such metal packages, while effective to provide shielding, are costly and difficult to fabricate particularly as the microwave components and the supporting substrates become smaller and smaller. A need therefore exists for a compact, inexpensive and easy-to-fabricate microwave circuit package. Applicant has found that all of these desirable characteristics may be realized by fabricating the circuit package of metallized, low cost, ceramic components. By metallizing the outer surfaces of the ceramic package components in more than one plane, continuity of the electrically conductive surfaces for shielding purposes and for maintaining the package at ground potential is readily achieved.

OBJECTIVES

It is, therefore, a principal objective of the invention to provide a low cost, shielded, microwave package.

Another objective of the invention is to provide a low cost, shielded package by utilizing metallized ceramic components.

Other objectives and advantages of the invention will become apparent as the description therof proceeds.

SUMMARY OF THE INVENTION

The various objectives and advantages of the invention are realized in a package including a ceramic seal ring, and a ceramic circuit supporting substrate positioned between metallic base and lid elements. The ceramic elements are metallized over portions of three of their surfaces to permit conductive continuity between the seal ring, the substrate, and the metallic lid and base of the package thereby providing integral shielding and ground for the microwave components mounted in the package. The surface metallization of the ceramic components is patterned to produce electrical isolation at the input/output ports of the package, but provide an integral ground connection between the package lid and the metallic package base.

DETAILED DESCRIPTION OF THE INVENTION

Figure 1:
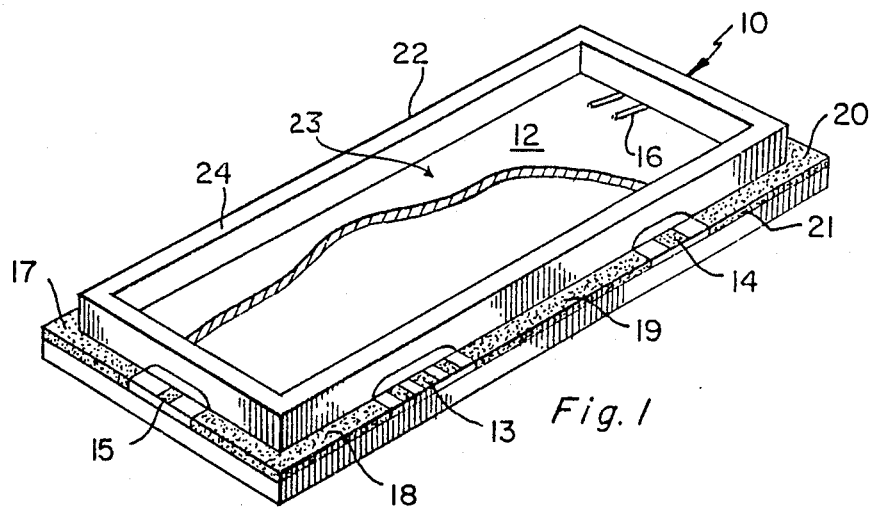
FIG. 1 is a perspective view of the assembled package without the package lid.

FIG. 1 shows an assembled, metallized, ceramic package 10 with the package lid removed. A partially metallized ceramic substrate 12 supports microwave circuit components, not shown, and on its upper surface also supports the input and output lines 13, 14, 15, and 16. The substrate, shown partially broken away, is preferable a ceramic composite such as a $AL_2O_3$/glass composite. Metal layers 17, 18, 19, and 20 are deposited on the upper surface and a metallized layer 21 is deposited on the vertical edges of the substrate. As will be shown in greater detail in FIGS. 2, 3, and 4, substrate 12 maintains a continuous conductive path between the substrate and the main seal ring 22 supported on the substrate. Seal ring 22 forms the major vertical substrate of the package and, when attached to the substrate, forms an interior chamber 23 in which the microwave components are supported. Seal ring 22, which is the vertical wall of the package, is also made of ceramic and is metallized on the three surfaces, two of which are shown in FIG. 1, and in greater detail in FIGS. 2–4. Thus seal ring 22 is metallized along both horizontal surfaces and along the vertical wall. The metallization is patterned to provide electrical isolation for the input and output conductors 13, 14, 15, and 16. That is, no metal is deposited above or adjacent to input and output leads 13–16 to prevent shorting of the leads. Similarly, there is no metallization on the underside of seal ring 22 in the areas overlying the input and output lines 13, 14, 15, and 16. Seal ring 22 and substrate 12 are joined by a sealiing glass material deposited over input/output lines 13, 14, 15, and 16 and the non-metallized underside of sealing sing 22 overlying the input-output leads. The sealing glass material is subjected to 500 degrees C. for 20 to 25 minutes to fuse the material and form a bond between the seal ring and the substrate. One commercially available form of the sealing glass material is marketed by the Micromaterials Company of 87 Woodlawn Avenue, Bristol, R.I. 02809 under its trade designation MMB6111.

Seal ring 22, as pointed out above, is metallized on three surfaces to provide an integral ground between the package lid, not shown, the substrate, and the base. Thus, in addition to metallization of the vertical wall, the seal ring is metallized on top surface 24 and on the bottom surface, not shown in FIG. 1, but illustrated in FIG. 3.

Figure 2:
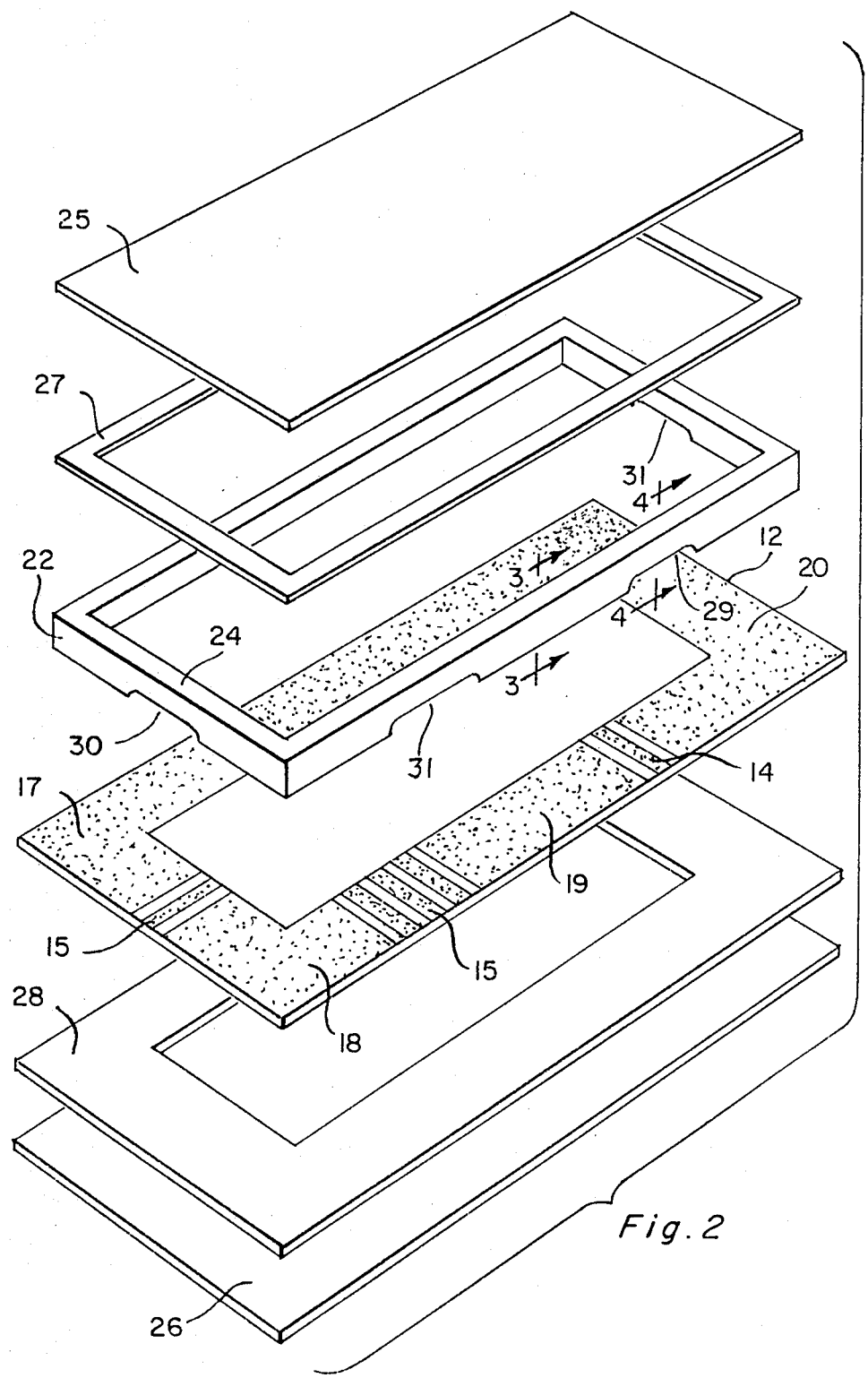
FIG. 2 is an exploded view of all of the components of the metallized ceramic package.

FIG. 2 is an exploded view of the package assembly shown in FIG. 1 with the addition of the metallic lid for closing the package. Thus, FIG. 2 shows a metal lid 25, a metal base 26, substrate 12, and seal ring 22. A solder preform 27 is positioned between lid 25 and seal ring 22 and will upon heating and reflow of the solder, fasten the package lid to the metallized top of the seal ring. Similarly, a brazing or solder preform 28 is positioned between the underside of substrate 12 and base 26 to secure base 26 to the bottom of metallized ceramic substrate 12.

Figure 3:
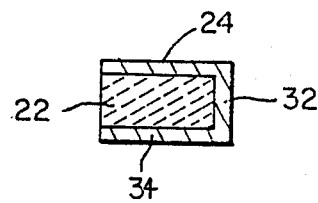
FIGS. 3 and 4 are sectional views of the metallized ceramic seal ring taken along lines 3—3 and 4—4 of FIG. 2.
Figure 4:
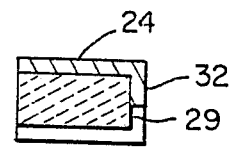

As may be seen in FIG. 2, seal ring 22 is metallized along the outer vertical surfaces with the exception of the areas 29, 30 and 31 which are aligned with and overlie input and output leads 13–16 on substrate 12. The underside of seal ring 22, although not shown in FIG. 2, is also metallized and aligned with the metallized patterns 17–20 on the upper surface of substrate 12 to maintain electrical conductivity between seal ring 22 and substrate 12. The metallized patterns on the upper surface of substrate 12 are also electrically connected with metallization 21 around the outer vertical surfaces of the substrate. Similarly, and not shown in FIG. 2, the underside of substrate 12 has a metallization pattern extending to the vertical edge which is aligned with and is of the same shape as solder preform 27 so that heating of the solder preform results in a solder joint being formed between metal base 25 and the metal pattern 34 on the underside of substrate 12. As can be seen in FIG. 3, seal ring 22 is metallized along three surfaces in the section taken along lines 3—3 of FIG. 2. The upper and lower horizontal surfaces are covered by metal layers 24 and 34, and the vertical side wall by layer 32. As can be seen in FIG. 4, which is a section taken in the area of input/output port 29, Ceramic seal ring 22 is covered by metallization layer 24 on the upper horizontal surface and with a partial verticl layer 32. Vertical layer 32 extends only to the input/output port area over the input and output leads 14, nor is there metallization along the underside in the area around the input/output lanes in order to prevent short-circuiting of these leads.

The solder preforms may typically be a 60-40Tin Lead composition with a melting temperature of 183 degrees C.

It will be apparent from the above description that a microwave circuit package has been described which is constituted principally of metallized, ceramic components to provide desired shielding of the microwave components. Electrical continuity of the package to provide the desired shielding is achieved by metallizing at least three surfaces of the ceramic components with the metallization patterns being such that they overlie so that conductivity exists between the package lid, the individual package components and the package base to provide a low cost, light weight, and readily manufacturable package.

What is claimed as new it is desired to be secured by U.S. Patents is:

1. A shielded RF package, comprising:
   a ceramic circuit board substrate including an edge and broad flat upper and lower surfaces for supporting electrical components above said flat upper surface, said substrate including metallization traces on said upper surface for defining interconnections of said components, said traces extending to a region near said edge for defining at least one of an input and an output conductor, said substrate also being metallized on said upper surface around the periphery thereof near said edge, except in an open region adjacent said input and output conductor, to form an upper ground conductor, said substrate also being metallized at least around the periphery of said broad lower surface, near said edge, to define a lower conductor, said substrate also being metallized on said edge, for interconnecting said upper ground conductor and said lower conductor;
   a ceramic seal ring defining horizontal upper and lower surfaces and inner and outer vertical surfaces, said seal ring being metallized on said horizontal upper surface and on said outer vertical surface, said seal ring also being metallized on said horizontal lower surface, except in an open region, to form a continuous conductive path between said metallization on said horizontal upper and lower surfaces of said seal ring by way of said metallization on said outer vertical surface, said seal ring being mounted upon said substrate with said unmetallized open regions of said substrate and ring in registry, and with said metallization on said horizontal lower surface of said seal ring in electrical contact with said metallization on said upper surface around said principal portion of said periphery, said seal ring being sealed in place with glass material in said unmetallized regions;
   a metallic lid supported by said metallization of said horizontal upper surface of said seal ring and sealed thereto by a first reflowed metal preform; and
   a metallic base supporting said ceramic circuit board substrate and sealed to at least said periphery of said metallized portion of said lower surface of said ceramic circuit board substrate by a second metal preform.

2. A package according to claim 1 wherein said first and second metal preforms are solder and braze preforms, respectively.

* * * * *